United States Patent [19]

Hamilton

[11] Patent Number: 4,942,614
[45] Date of Patent: Jul. 17, 1990

[54] CALIBRATION OF ULTRASONIC TRANSDUCERS

[75] Inventor: Norman Hamilton, Cremorne, Australia

[73] Assignee: Australian Atomic Energy Commission, Lucas Heights, Australia

[21] Appl. No.: 35,441

[22] Filed: Apr. 7, 1987

[30] Foreign Application Priority Data

Apr. 16, 1986 [AU] Australia ............................ PH05496

[51] Int. Cl.$^5$ ....................... G01D 18/00; G01R 23/00
[52] U.S. Cl. .............................. 364/571.01; 324/77 R; 364/484; 367/13
[58] Field of Search ............... 364/481, 483, 484–487, 364/571, 576; 346/33 ME, 107 SC, 110 R, 107 R; 324/77 R, 77 B, 77 K; 358/296; 367/13

[56] References Cited

U.S. PATENT DOCUMENTS

| | | | |
|---|---|---|---|
| 4,607,216 | 8/1986 | Yamaguchi et al. | 364/576 |
| 4,641,348 | 2/1987 | Neuder et al. | 324/77 R |
| 4,649,496 | 3/1987 | Anderson et al. | 324/77 R |
| 4,665,494 | 5/1987 | Tanaka et al. | 324/77 B |
| 4,669,052 | 5/1987 | Bianco | 364/571 |
| 4,685,065 | 8/1987 | Braun et al. | 324/77 B |
| 4,686,457 | 8/1987 | Banno | 324/77 B |
| 4,736,250 | 4/1988 | Blazo | 346/110 R |
| 4,748,598 | 5/1988 | Kopke | 367/13 |

Primary Examiner—Kevin J. Teska
Attorney, Agent, or Firm—Ladas & Parry

[57] ABSTRACT

An ultrasonic test set is calibrated in terms of its frequency characterization by establishing a response trace on a monitor screen of the test set when the probe of the test set is applied to a standard test article, a digitizing camera is arranged for scanning the trace on the test set monitor, and a digital computer receives the digital output signal on the digitizing camera and processes the signal by sampling the signal trace at discrete points with respect to time; the digital computer provides an output on output means such as a monitor screen and/or printer which provides information on the frequency characterization of the ultrasonic test device and includes a frequency spectrum. The apparatus can be implemented by a combination of commercially available and known separate elements providing a cheap and effective apparatus and method for calibration purposes.

10 Claims, 3 Drawing Sheets

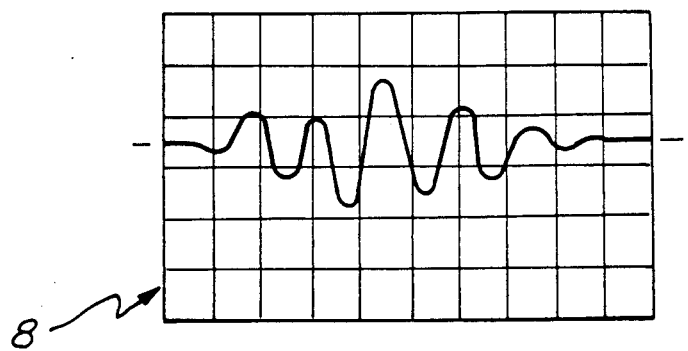
FIG. 3
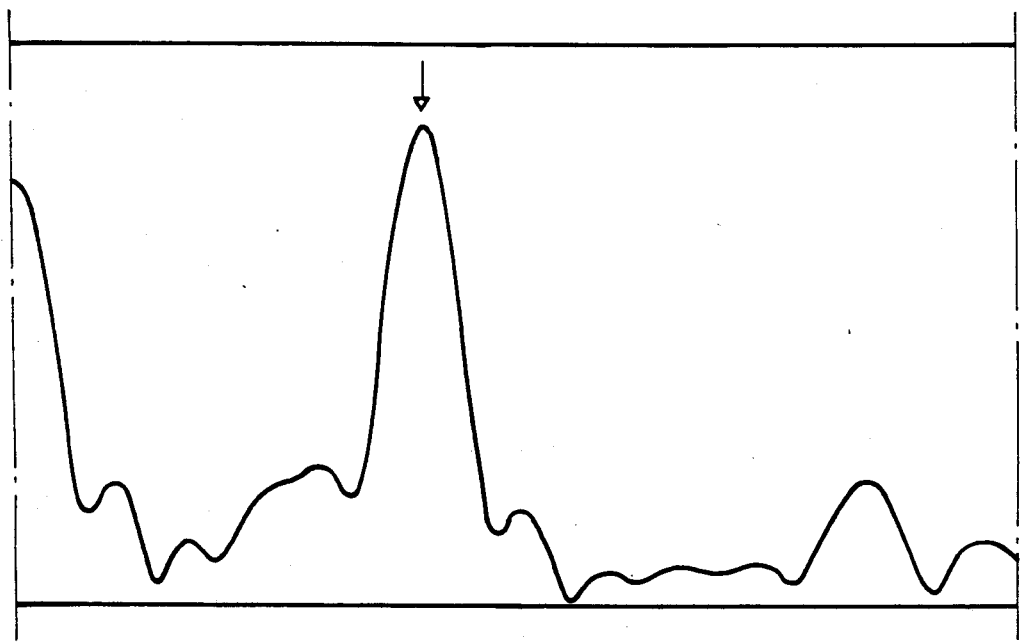
PROBE   NUMBER                    P 2217        FIG. 4
PEAK  FREQUENCY                   3.82 MHZ
-3 DB  FREQUENCIES        3.59,   4.21 MHZ
-6 DB  FREQUENCIES        3.47,   4.33 MHZ
-3 DB  BANDWIDTH                  .625 MHZ
BANDWIDTH CENTRE FREQUENCY        3.90 MHZ

CALIBRATION OF ULTRASONIC TRANSDUCERS

FIELD OF THE INVENTION

The present invention relates to the frequency calibration of ultrasonic transducers and is more particularly concerned with the calibration of ultrasonic systems for non-destructive testing (NDT).

BACKGROUND TO THE INVENTION

In fields such as the aircraft industry, it is very important to be able to effect NDT on various components either after manufacture or after a period of service in order to assess whether any structural faults or metallurgical defects exist. A well established technique has been to use ultrasonic test apparatus. In such apparatus a pulsed ultrasonic signal is transmitted from a transducer into a work piece and the reflected signal recorded in terms of amplitude of received signal as a function of time. The signal is subsequently analysed and interpreted. However, the analysis and interpretation depends upon an accurate knowledge of the frequency characterisation of the transducer system. This varies from transducer to transducer and indeed from installation to installation depending on the cable arrangements, local conditions and other factors even when using transducers of the same fundamental design. Accordingly it has been important to check regularly the frequency characterisation by use of a spectrum analyser and special instrumentation. For example, Aerospace Standard AS1355 of the Society of Automotive Engineers, Inc. of U.S.A. lays down a standard for the use of a spectrum analyser with ultrasonic transducers. Such equipment however, is relatively expensive and such capital investment presents difficulties to operators having a limited number of ultrasonic transducers which only require periodic assessment of their frequency characterisation.

Accordingly, there is a need for an inexpensive and convenient alternative, particularly for users having conventional ultrasonic test equipment. Conventional ultrasonic test equipment includes a cathode ray tube which displays the amplitude of the received signals with respect to time, but does not provide a calibrated time base nor output signal and synchronisation pulses.

SUMMARY OF THE INVENTION

The present invention, in one aspect, consists in an apparatus for calibrating an ultrasonic test device in terms of its frequency characterisation, the apparatus comprising a digitising camera for scanning a representation of a signal trace which is representative of a received signal of an ultrasonic transducer and its variation with respect to time, a digital computer for receiving the digital output signal of the digitising camera and arranged for processing said digitised output by sampling said signal trace at discrete points with respect to time, the digital computer being arranged to provide an output on output means, said output providing information on the frequency characterisation of the ultrasonic test device and including a frequency spectrum.

In another aspect, the invention consists in an ultrasonic test set having an ultrasonic transducer for providing a signal into and detecting a signal from a workpiece and a cathode ray display for displaying a signal trace representative of the variation of the received signal with time and arranged for co-operating relationship with the apparatus described in the first aspect of the invention.

Preferably, the invention is implemented with a display monitor and optional dot matrix printer connected to the output of the digital computer whereby there is produced a frequency response curve.

Preferably, the digital computer is programmed to provide also an output of at least some of the following parameters:

Peak frequency;
3 dB frequencies:
6 dB frequencies;
3 dB bandwidth; and
Bandwidth centre frequency.

In an important and preferred embodiment of the invention, the computer is arranged to process its input data by a fast fourier Transform algorithm.

In another aspect of the invention, there is provided a method of ultrasonic testing in which before and after testing of a workpiece the transducer response is established by the production of a corresponding representative trace and each of these traces are analysed using the digitising camera and digital computer combination described above. This embodiment can be applied most advantageously to field work in which a photograph is taken of the cathode ray tube of the ultrasonic test set when the transducer is under test, and the traces can be analysed at a later date at another site such as a laboratory.

Preferably, the digital computer is programmed so that a display of the frequency spectrum provided by the computer requires the operator to select by eye the region of the peak frequency and instruct the computer accordingly; then the computer calculates the precise frequency and other parameters to be displayed.

BRIEF DESCRIPTION OF THE DRAWINGS

An embodiment of the invention will now be described, by way of example, with reference to the accompanying drawings of which:

FIG. 3 illustrates the test set screen when adjusted for suitable echo pulse position;

FIG. 4 is a sample output illustrating the results of a typical frequency characterisation using the apparatus of FIG. 1;

DETAILED DESCRIPTION OF THE DRAWINGS

Figure 1:
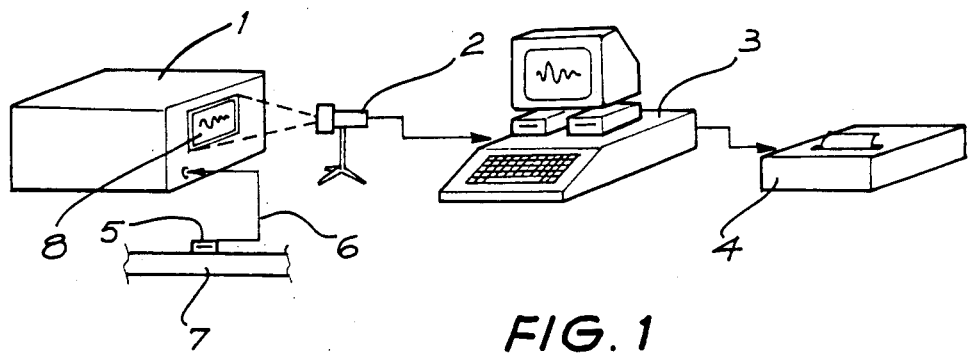
FIG. 1 is a schematic diagram of an apparatus set up for practising the present invention.

As shown in FIG. 1, the apparatus is arranged to operate on a conventional ultrasonic test set 1 in front of which a digitising camera 2 is mounted for providing a digital signal to a suitable micro-computer 3, which in turn is connected to a dot matrix printer 4.

The test set 1 comprises a transducer 5 connected by a cable 6 to the test set and arranged to operate on a workpiece 7. The test set also incorporates a cathode ray tube screen 8 which is arranged to display a trace. The test set is operated in the pulse echo mode and the screen 8 displays the transducer response of amplitude against time.

Figure 2:
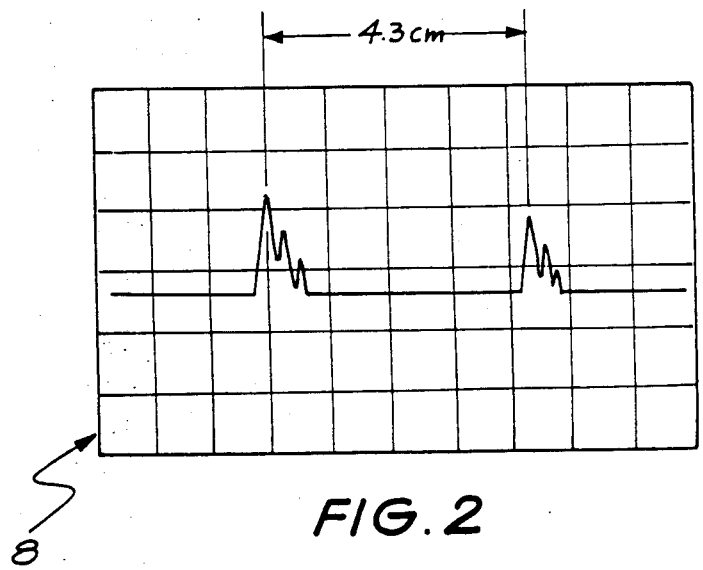
FIG. 2 illustrates the cathode ray screen of the ultrasonic test set shown in FIG. 1 when in a calibration mode.

A convenient standard workpiece for calibration of the test set is a steel test block (such as a standard IIW V1 steel block which is 1 inch thick) it can be calculated that for such a test block the time between successive echoes at the transducer will be 8.6 microseconds. The screen 8 as shown in FIG. 2 has a marked grid thereon typically 10 cm. wide and it is convenient to set up the test so that this 10 cm. width corresponds to a time of 20 microseconds when the test set has been set to a depth range of 50 mm. A test set usually has a multi-position switch permitting different depth ranges to be selected for different modes of operation and once the width of the screen has been set to correspond to 20 microseconds on the 50 mm range, when other ranges of depth are selected the time scale across the screen will correspond.

With the 50 mm depth range selected, echo spacing should be 4.3 cm across the grid. The continuous velocity control (labelled "variable depth") is adjusted until the echoes seen on the screen are spaced correctly, as shown in FIG. 2.

With a different depth range selected e.g. 250 mm, then the 10 cm screen width corresponds with 100 microseconds.

To enable correct sampling of the echo pulse wave form, which is arranged to be mapped into the computer screen memory from the digitising camera 2, it is necessary to ensure that the camera is correctly positioned with respect to the test set screen 8 in terms of both distance and orientation. The precise position is likely to vary from camera to camera and physical adjustments should be made so that the 10 cm wide test set screen 8 corresponds with the full width of the monitor screen so that best resolution and performance can be achieved. For example, when the microcomputer is an Apple II the monitor has a screen width of 280 pixels.

The digitising camera may be a known device such as the "MICRON EYE" brand device which utilises an array of pixels; when the device is exposed through software control to a particular image onto which it is focused, it produces a high contrast digital representation.

The "MICRON EYE" brand camera has a 16 mm focal length lens as standard but it is more convenient to use a 5 mm focal length lens so that the camera can be positioned close to the test screen 8 in a suitable mount whereby the whole test screen can be viewed for sampling purposes.

Using an "Apple II" digital microcomputer and monitor, a suitable procedure for adjusting the camera would be as follows:
1. Boot the microcomputer and type the following commands:
   HGR
   HPLOT 0,0 TO 0,191
   HPLOT 279,0 TO 279,191
2. Trace these lines on the monitor screen with a white grease pencil or other marker.
3. Turn up the graticule illumination on the test set.
4. Following the operating instructions in the digital camera manual, photograph the graticule.
5. Adjust the camera so that the 0 and 10 cm graticule lines are vertical and under the traced lines on the monitor.

To avoid the necessity of repeating this procedure each time the camera is set up, it is desirable to manufacture a jig for holding the camera in the correct position with a particular test set. Providing standard illumination conditions are used only periodic checking of the monitor from time to time would be needed to detect any drift in the screen display.

FIG. 3 shows a suitable wave form at the test set to facilitate the present apparatus operating to provide acurate frequency information. The test set is best adjusted by using the AC (unrectified) mode and adjustments are made to restrict the peak-to-peak amplitude of the wave form to less than 3 cm due to the shallow aspect ratio of the digital camera. The start and end points of the waveform at the 0 and 10 cm limit marks should be intercepted near zero volts to avoid abrupt truncation of the waveform, which could cause false frequency components to be injected.

The computer 3 is arranged to sample the digitised signal obtained from the camera 2. The controlling software is utilised to cause the signal captured by the camera to be mapped into the screen memory space of the computer. The computer software then causes this stored information to be sampled at points representative of regular time intervals. 40 original samples are taken. Further signal processing is effected from these samples to expand the number of samples artificially to 512 samples, the frequency information in the samples being not disturbed in this process. The purpose of increasing the original samples in number is to improve the resolution of the spectrum produced and to provide a more convenient presentation.

The computer is loaded with a program to effect a fast fourier transform algorithm on the stored data representative of the trace on the test set. The computer performs transforms on the 516 samples in order to display the frequency characterisation shown in FIG. 2, wherein the data is transformed into the form of 256 frequency amplitudes The values are scaled to give an optimum size display on the computer screen. FIG. 4 shows the variation of amplitude with frequency when operated with a transducer having a nominal frequency of 2 MHz.

Figure 5:
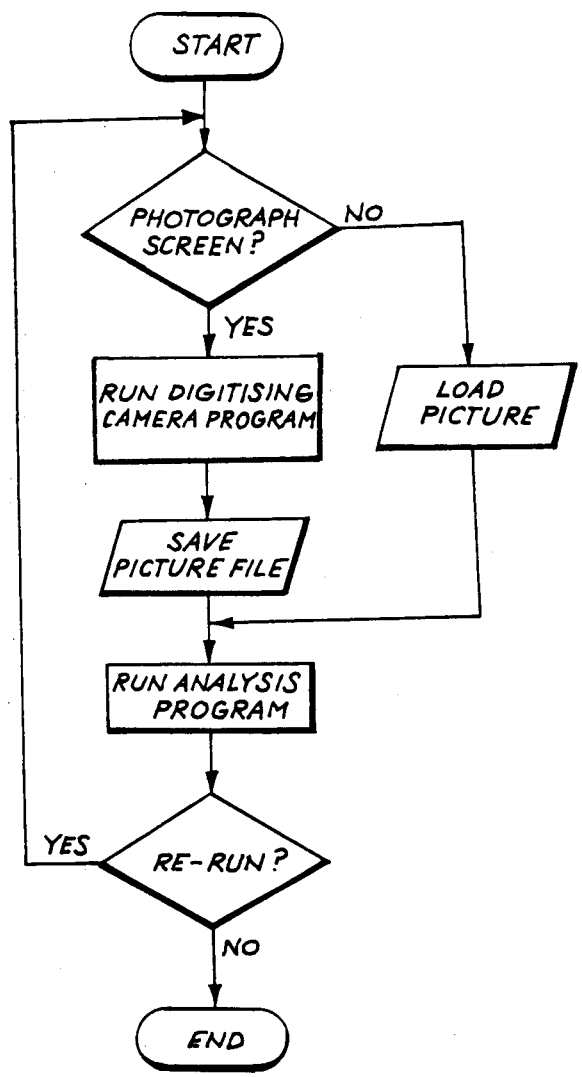
FIG. 5 is a main computer program flow chart for use in the computer of FIG. 1.
Figure 6:
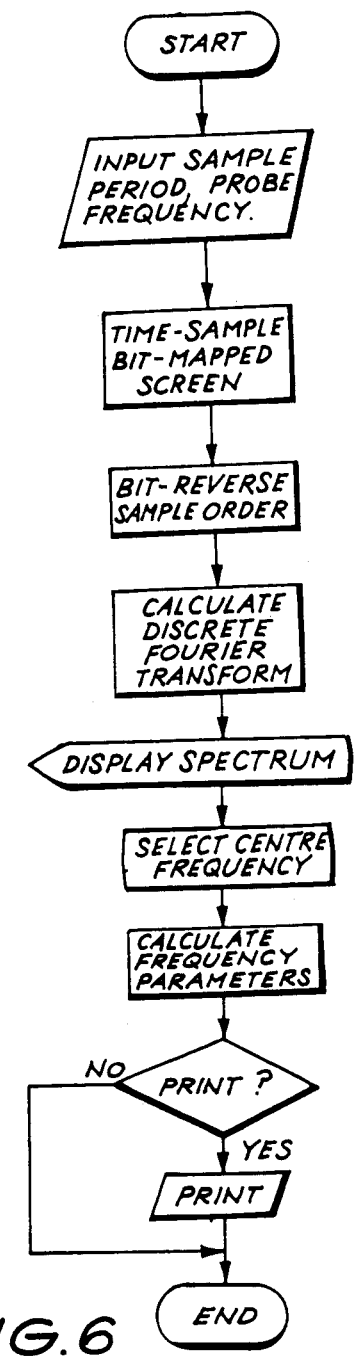
FIG. 6 is a flow chart of the analysis program included in the flow chart of FIG. 5.

The software is arranged to provide an arrow on the screen and initially this will be located anywhere across the screen; the software will provide a screen read out of the frequency corresponding to the position of the arrow. Using cursor control keys, the operator simply moves the arrow across the screen to align it with the top of the most significant peak on the echo curve as shown in FIG. 4. The operator inputs a command to indicate that manual selection is completed. The computer software is arranged so as then to sample the curve in the region of the manually selected position and the position of the arrow is automatically adjusted if necessary to be precisely on the peak. The software causes the following information to be given in a typical case.
PEAK FREQUENCY: 3.82 MHZ
3 DB FREQUENCIES: 3.59, 4.21 MHZ
6 DB FREQUENCIES: 3.47, 4.33 MHZ
3 DB BANDWIDTH: 0.625 MHZ
BANDWIDTH CENTRE FREQUENCY: 3.90 MHZ FIGS. 5 and 6 provide the flow charts for the main computer program and analysis program.

I claim:
1. Ultrasonic test apparatus comprising an ultrasonic test device of the type which includes a display to display output traces, a digitising camera for scanning and digitizing an output resulting from a test object which is displayed on the ultrasonic test device as a trace which is representative of a received signal of an ultrasonic transducer and its variation with respect to time, a digital computer adapted to receive a digital output signal of the digitising camera and to process said digital output by sampling said digital output representing said signal trace at discrete points with respect to time to determine information on the frequency characterisation of the ultrasonic test device, the frequency characterisation including a frequency spectrum, the digital computer having output means to output information representative of said frequency characterisation.

2. Apparatus as claimed in claim 1 and wherein the digital computer determines and provides, as an output, a listing of peak frequency and bandwidth.

3. Apparatus as claimed in claim 1 wherein the digital computer provides, as an output, the following parameters:
Peak frequency;
3 dB frequencies;
6 dB frequencies;
3 dB bandwidth; and
Bandwidth centre frequency.

4. An apparatus as claimed in claim 1 and wherein the digital computer processes said digital output by employing a fast Fourier transform algorithm.

5. Apparatus as claimed in claim 1 and wherein the output means comprises a monitor including a cursor for the digital computer to display the frequency spectrum, and the digital computer further comprises means for receiving a command when an operator has positioned the cursor at a relevant peak in the frequency spectrum so displayed, the digital computer then operating to calculate the precise frequency and other relevant parameters of the frequency spectrum.

6. A method of ultrasonic testing, comprising the following steps:
using an ultrasonic test device to perform nondestructive tests, by displaying an output trace on a display means of the device;
arranging a digitising camera to record the trace appearing on the display means;
scanning the output trace resulting from a test object which is representative of a received signal of an ultrasonic transducer and its variation with the respect to time using the digitising camera;
digitizing the scanned trace using the digitizing camera;
feeding a digital output representing the digitised trace to a digital computer;
using the digital computer to process said digital output by sampling said digital output which represents said signal trace at discrete points with respect to time to determine information on the frequency characterization of the ultrasonic test device, said frequency characterization including a frequency spectrum, and applying output information from the digital computer to output means, said output being representative of said frequency characterization.

7. A method according to claim 6 including using the digital computer to determine and provide an output listing of peak frequency and bandwidth.

8. A method according to claim 6 including using the computer to provide an output of the following parameters:
Peak frequency;
3 dB frequencies
6 dB frequencies;
3 dB bandwidth; and
Bandwidth centre frequency.

9. A method according to claim 6, including causing the digital computer to process said digital output using a fast fourier transform algorithm.

10. A method according to claim 6, wherein the output means comprises a monitor including a cursor for the digital computer to display the frequency spectrum, the method of ultrasonic testing including applying a command to the digital computer when an operator has positioned the cursor at a relevant peak in the frequency spectrum so displayed for causing the digital computer to calculate the precise frequency and other relevant parameters of the frequency spectrum.

* * * * *